United States Patent
Bruce et al.

(10) Patent No.: US 6,908,792 B2
(45) Date of Patent: Jun. 21, 2005

(54) CHIP STACK WITH DIFFERING CHIP PACKAGE TYPES

(75) Inventors: Ted Bruce, Villa Park, CA (US); John A. Forthun, Glendora, CA (US)

(73) Assignee: Staktek Group L.P., Austin, TX (US)

(*) Notice: Subject to any disclaimer, the term of this patent is extended or adjusted under 35 U.S.C. 154(b) by 212 days.

(21) Appl. No.: 10/263,859

(22) Filed: Oct. 3, 2002

(65) Prior Publication Data

US 2003/0025211 A1 Feb. 6, 2003

Related U.S. Application Data

(62) Division of application No. 09/912,010, filed on Jul. 24, 2001, now Pat. No. 6,627,984.

(51) Int. Cl.[7] .............................................. H01L 21/77
(52) U.S. Cl. ........................ 438/110; 438/108; 438/109
(58) Field of Search ................................. 257/684–686, 257/777, 778; 438/108–110

(56) References Cited

U.S. PATENT DOCUMENTS

| | | | | |
|---|---|---|---|---|
| 3,766,439 A | * | 10/1973 | Isaacson | 361/714 |
| 4,928,206 A | * | 5/1990 | Porter et al. | 361/699 |
| 4,956,694 A | | 9/1990 | Eide | |
| 5,117,282 A | * | 5/1992 | Salatino | 257/686 |
| 5,313,096 A | | 5/1994 | Eide | |
| 5,345,205 A | * | 9/1994 | Kornrumpf | 333/246 |
| 5,448,511 A | * | 9/1995 | Paurus et al. | 365/52 |
| 5,612,570 A | * | 3/1997 | Eide et al. | 257/686 |
| 5,646,446 A | * | 7/1997 | Nicewarner et al. | 257/723 |
| 5,950,304 A | | 9/1999 | Khandros et al. | |
| 6,061,245 A | * | 5/2000 | Ingraham et al. | 361/749 |
| 6,225,688 B1 | * | 5/2001 | Kim et al. | 257/686 |
| 6,281,577 B1 | * | 8/2001 | Oppermann et al. | 257/724 |
| 6,300,679 B1 | * | 10/2001 | Mukerji et al. | 257/738 |
| 6,376,769 B1 | * | 4/2002 | Chung | 174/52.2 |
| 6,426,240 B2 | * | 7/2002 | Isaak | 438/106 |
| 6,426,560 B1 | * | 7/2002 | Kawamura et al. | 257/777 |
| 6,473,308 B2 | * | 10/2002 | Forthun | 361/749 |
| 6,492,718 B2 | * | 12/2002 | Ohmori | 257/686 |
| 6,576,992 B1 | * | 6/2003 | Cady et al. | 257/686 |
| 6,683,377 B1 | * | 1/2004 | Shim et al. | 257/723 |

* cited by examiner

*Primary Examiner*—George Eckert
*Assistant Examiner*—Eugene Lee
(74) *Attorney, Agent, or Firm*—Andrews Kurth LLP

(57) ABSTRACT

A chip stack comprising a flex circuit which itself comprises a flexible substrate having opposed, generally planar top and bottom surfaces. Disposed on the top surface of the substrate in spaced relation to each other are at least first and second top conductive patterns. Similarly, disposed on the bottom surface of the substrate in spaced relation to each other are at least first and second bottom conductive patterns. The first top and bottom conductive patterns are electrically connected to each other, as are the second top and bottom conductive patterns. At least one top chip package including a first packaged chip is electrically connected to the first top conductive pattern, with at least one bottom chip package including a second packaged chip being electrically connected to the second bottom conductive pattern. The substrate is folded such that the second top conductive pattern is electrically connected to the top chip package.

5 Claims, 4 Drawing Sheets

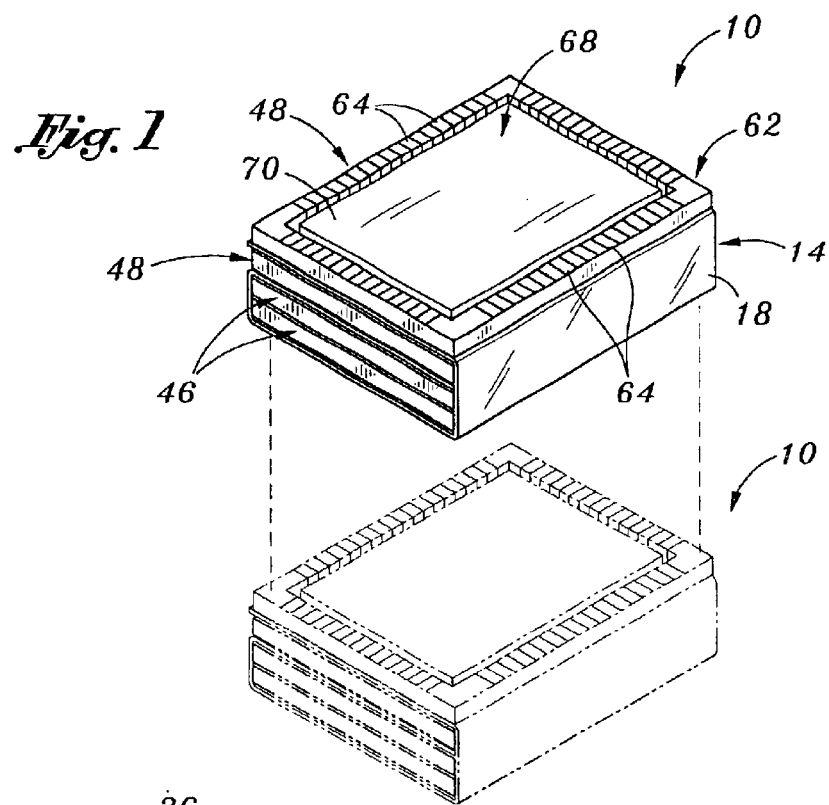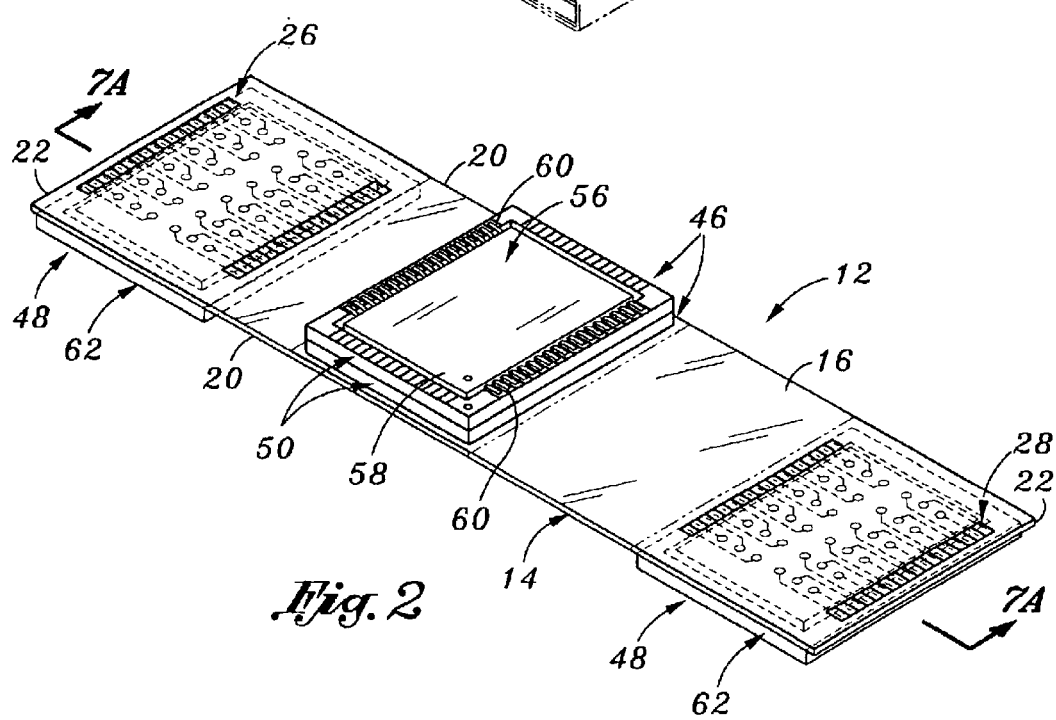

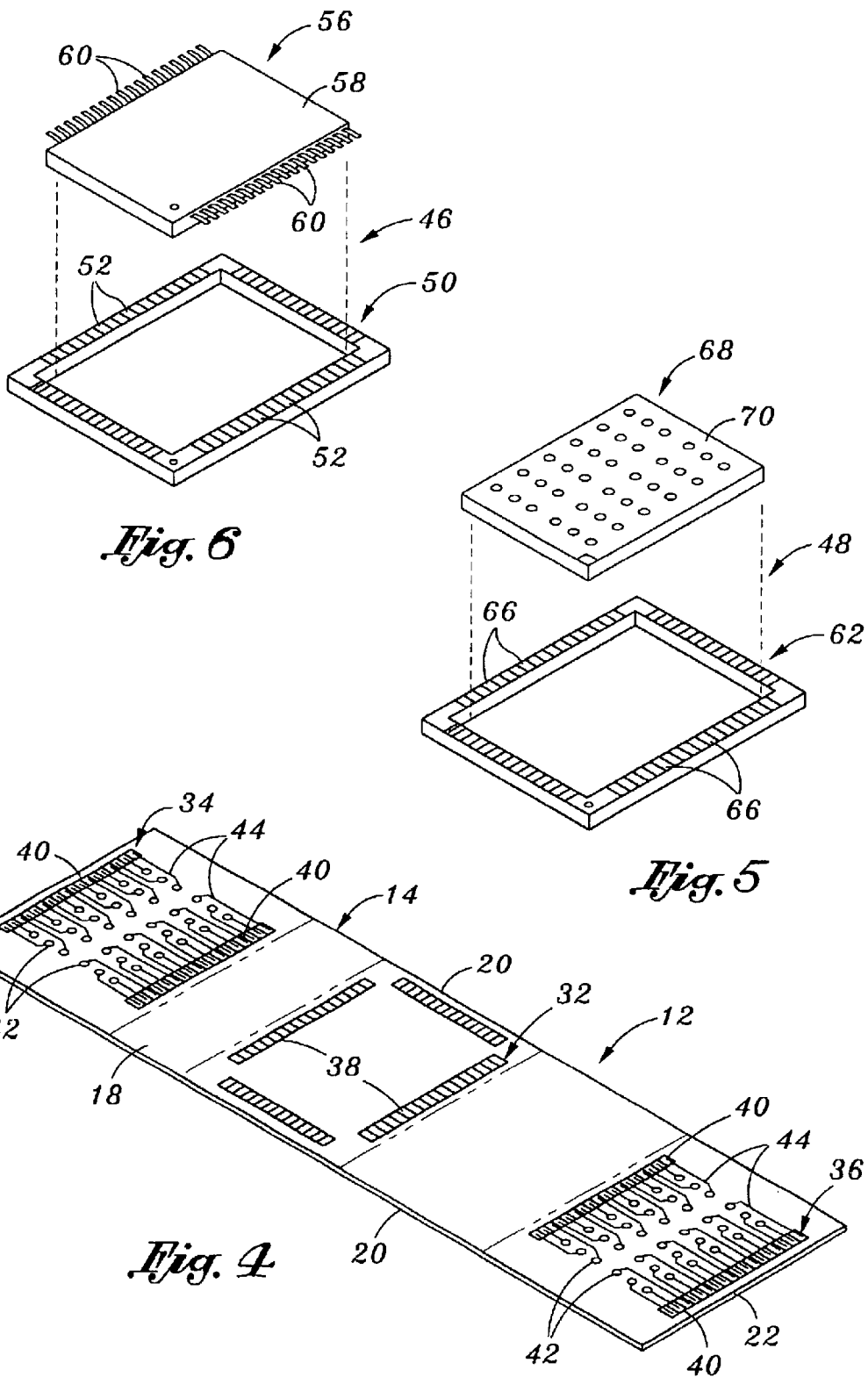

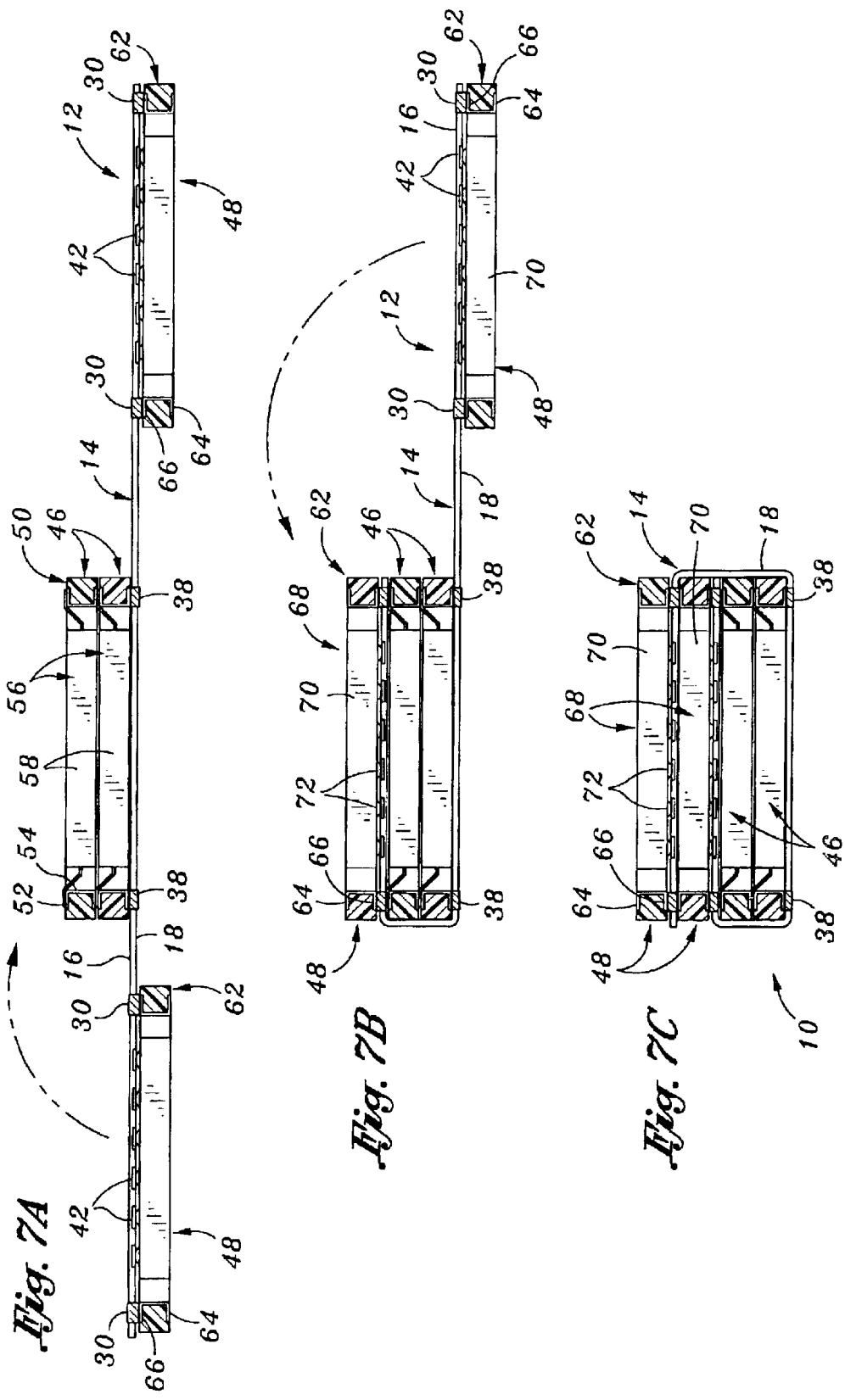

CHIP STACK WITH DIFFERING CHIP PACKAGE TYPES

CROSS-REFERENCE TO RELATED APPLICATIONS

This is a division of U.S. application Ser. No. 09/912,010 filed Jul. 24, 2001 now U.S. Pat. No. 6,627,984.

STATEMENT RE: FEDERALLY SPONSORED RESEARCH/DEVELOPMENT (Not Applicable)

BACKGROUND OF THE INVENTION

The present invention relates generally to chip stacks, and more particularly to a chip stack including a uniquely configured flex circuit which allows different types of packaged chips to be placed into electrical communication with each other in a stacked configuration.

Multiple techniques are currently employed in the prior art to increase memory capacity on a printed circuit board. Such techniques include the use of larger memory chips, if available, and increasing the size of the circuit board for purposes of allowing the same to accommodate more memory devices or chips. In another technique, vertical plug-in boards are used to increase the height of the circuit board to allow the same to accommodate additional memory devices or chips.

Perhaps one of the most commonly used techniques to increase memory capacity is the stacking of memory devices into a vertical chip stack, sometimes referred to as 3D packaging or Z-Stacking. In the Z-Stacking process, from two (2) to as many as eight (8) memory devices or other integrated circuit (IC) chips are interconnected in a single component (i.e., chip stack) which is mountable to the "footprint" typically used for a single package device such as a packaged chip. The Z-Stacking process has been found to be volumetrically efficient, with packaged chips in TSOP (thin small outline package) or LCC (leadless chip carrier) form generally being considered to be the easiest to use in relation thereto. Though bare dies or chips may also be used in the Z-Stacking process, such use tends to make the stacking process more complex and not well suited to automation.

In the Z-Stacking process, the IC chips or packaged chips must, in addition to being formed into a stack, be electrically interconnected to each other in a desired manner. There is known in the prior art various different arrangements and techniques for electrically interconnecting the IC chips or packaged chips within a stack. Examples of such arrangements and techniques are disclosed in Applicant's U.S. Pat. No. 4,956,694 entitled INTEGRATED CIRCUIT CHIP STACKING issued Sep. 11, 1990, U.S. Pat. No. 5,612,570 entitled CHIP STACK AND METHOD OF MAKING SAME issued Mar. 18, 1997, and U.S. Pat. No. 5,869,353 entitled MODULAR PANEL STACKING PROCESS issued Feb. 9, 1999.

The various arrangements and techniques described in these issued patents and other currently pending patent applications of Applicant have been found to provide chip stacks which are relatively easy and inexpensive to manufacture, and are well suited for use in a multitude of differing applications. However, one major drawback associated with currently known chip stack arrangements and chip stacking techniques is the inability to quickly, easily and inexpensively create chip stacks including dissimilar packaged chips, i.e., packaged chips of differing types.

The present invention provides yet a further alternative arrangement and technique for forming a chip stack which involves the use of a uniquely configured flex circuit or substrate specifically adapted to allow multiple chip packages including different types of packaged chips to be electrically interconnected to each other in a stacked configuration or arrangement. For example, a chip stack constructed in accordance with the present invention incorporating the flex circuit thereof may include a mixture of TSOP and BGA (ball grid array) packaged chips or devices, or a mixture of discrete or passive encased devices. The flex circuit also provides various advantages in the assembly of the chip stack, including significantly greater ease in achieving and maintaining the alignment between the chip packages having the dissimilar packaged chips. These, and other advantages of the present invention, will be discussed in more detail below.

BRIEF SUMMARY OF THE INVENTION

In accordance with the present invention, there is provided a chip stack which comprises a flex circuit or similar substrate. The flex circuit itself comprises a flexible substrate having opposed, generally planar top and bottom surfaces. Disposed on the top surface of the substrate in spaced relation to each other are first, second, and third top conductive patterns. Similarly, disposed on the bottom surface of the substrate in spaced relation to each other are first, second and third bottom conductive patterns. The first top and bottom conductive patterns are electrically connected to each other, as are the second top and bottom conductive patterns and the third top and bottom conductive patterns.

In addition to the flex circuit, the chip stack comprises at least first and second identically configured top chip packages. The first top chip package is electrically connected to the first top conductive pattern, with the second top chip package being electrically connected to the first top chip package. In addition to the top chip packages, the chip stack includes at least first and second identically configured bottom chip packages. The first bottom chip package is electrically connected to the second bottom conductive pattern, with the second bottom chip package being electrically connected to the third bottom conductive pattern. In the present chip stack, the substrate is folded such that the second top conductive pattern is electrically connected to the second top chip package, and the third top conductive pattern is electrically connected to the first bottom chip package.

In the present chip stack, each of the first and second top chip packages include a first packaged chip, with each of the first and second bottom chip packages including a second packaged chip differing from the first packaged chip. The first packaged chip of each of the first and second top chip packages is preferably a TSOP device, with the second packaged chip of each of the first and second bottom chip packages preferably being a BGA device.

In addition to the first and second packaged chips, the first and second top chip packages and the first and second bottom chip packages each further comprise a frame having a conductive pad array disposed thereon. In the present chip stack, the conductive pad array of the frame of the first top chip package is electrically connected to the first top conductive pattern, with the conductive pad array of the second top chip package being electrically connected to the conductive pad array of the first top chip package. Additionally, the conductive pad array of the first bottom chip package is electrically connected to the second bottom conductive pattern, with the conductive pad array of the second bottom chip package being electrically connected to the third bottom conductive pattern. The first packaged chip of each of the first second top chip packages comprises a body defining an opposed pair of sides and having a multiplicity of conductive leads protruding from each of the sides thereof. The conductive leads of the first packaged chip of each of the first and second top chip packages is electrically connected to a respective one of the conductive pad arrays thereof. The second packaged chip of each of the first and second bottom chip packages itself comprises a body having opposed, generally planar top and bottom surfaces and a multiplicity of conductive contacts protruding from the bottom surface. The conductive contacts of the second packaged chip of each of the first and second bottom chip packages are electrically connected to a respective one of the conductive pad arrays thereof via a respective one of the second and third conductive patterns.

In the present chip stack, each of the frames preferably has a generally rectangular configuration defining opposed pairs of longitudinal and lateral side segments. Similarly, the substrate preferably has a generally rectangular configuration defining opposed pairs of longitudinal and lateral peripheral edge segments. The substrate, the first and second top chip packages, and the first and second bottom chip packages are sized relative to each other such that the lateral side segments of the frames do not protrude beyond the longitudinal peripheral edge segments of the substrate in the fully assembled chip stack.

BRIEF DESCRIPTION OF THE DRAWINGS

These, as well as other features of the present invention, will become more apparent upon reference to the drawings wherein:

FIG. 1 is a perspective view of a chip stack constructed in accordance with the present invention;

FIG. 2 is a perspective view of the present chip stack in an unwrapped configuration prior to the folding of the flex circuit thereof;

FIG. 4 is a perspective view of the bottom surface of the flex circuit of the present chip stack, the top surface of the flex circuit being shown in FIG. 3;

FIG. 5 is an exploded view of one of the chip packages of the present chip stack having a BGA packaged chip;

FIG. 6 is an exploded view of one of the chip packages of the present chip stack having a TSOP packaged chip; and FIGS. 7A, 7B, and 7C are side-elevational views illustrating the step by step sequence in which the flex circuit is folded to facilitate the assembly of the present chip stack.

DETAILED DESCRIPTION OF THE INVENTION

Figure 3:
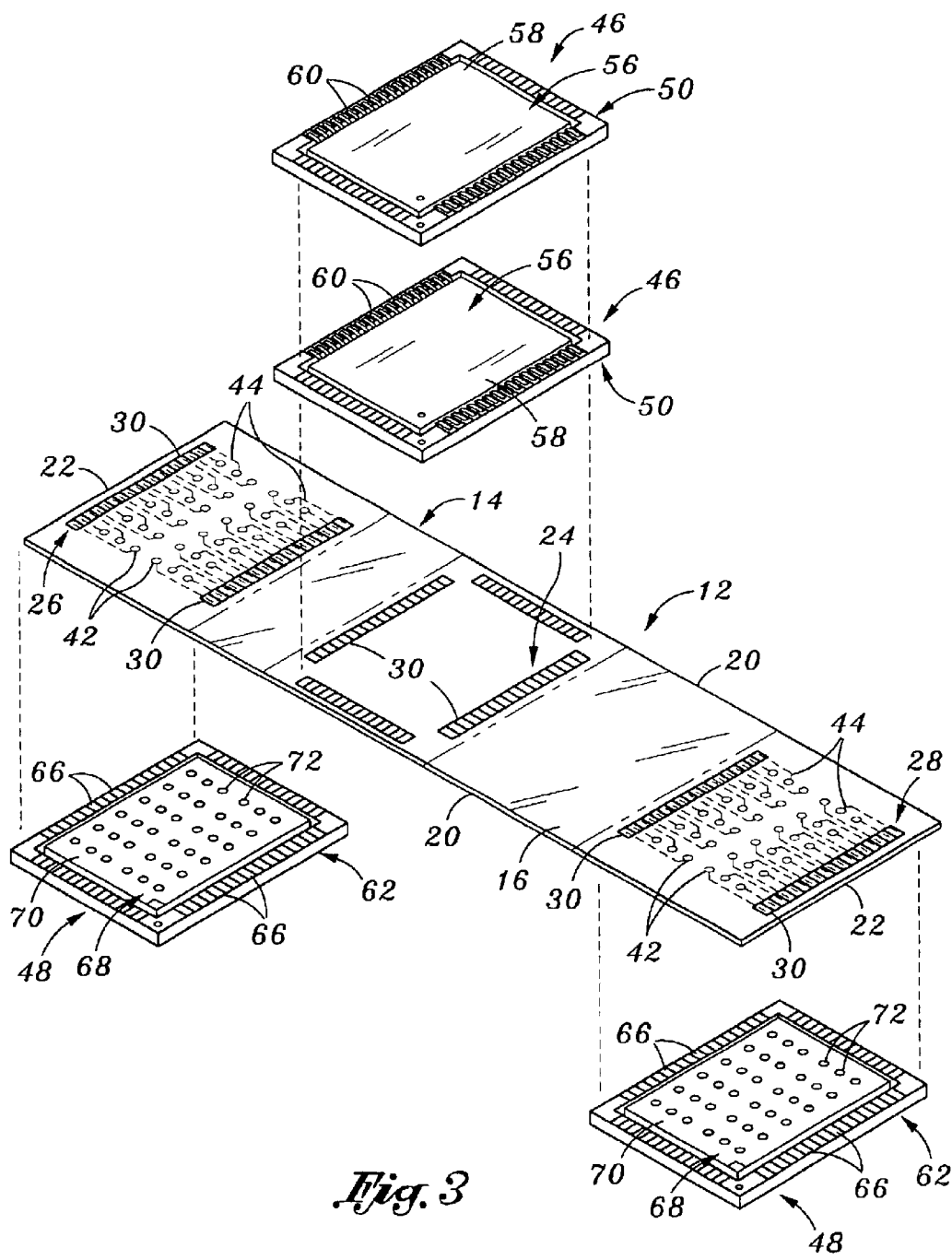
FIG. 3 is an exploded view illustrating the manner in which the chip packages of the present chip stack are electrically connected to the flex circuit thereof.

Referring now to the drawings wherein the showings are for purposes of illustrating a preferred embodiment of the present invention only, and not for purposes of limiting the same, FIG. 1 prospectively illustrates a chip stack 10 constructed in accordance with the present invention. As will be discussed in more detail below, the chip stack 10 is uniquely configured to allow dissimilar package chips or passive devices(e.g., TSOP devices and BGA devices) to be electrically connected to each other in stacked, vertical registry.

Referring now to FIGS. 2–4, the chip stack 10 comprises a flex circuit 12 which itself comprises a flexible substrate 14 having a generally planar top surface 16 (shown in FIGS. 2 and 3) and a generally planar bottom surface 18 (shown in FIG. 4). The substrate 14 preferably has a generally rectangular configuration and defines a pair of longitudinal peripheral edge segments 20 and a pair of lateral peripheral edge segments 22. The substrate 14 is preferably fabricated from a polyamide which has a thickness of several mils or less, and may have a thickness down to about one mil.

As best seen in FIG. 3, disposed on the top surface 16 of the substrate 14 is a first (center) top conductive pattern 24, a second top conductive pattern 26, and a third conductive pattern 28. The second and third top conductive patterns 26, 28 are disposed on opposite sides of the first top conductive pattern 24 adjacent respective ones of the lateral peripheral edge segments 22 of the substrate 14. The first, second and third top conductive patterns 24, 26, 28 each preferably comprise at least two spaced apart rows of conductive pads 30 which extend in generally parallel relation to each other and to the lateral peripheral edge segments 22, and thus extend in generally perpendicular relation to the longitudinal peripheral edge segments 20. As best seen in FIG. 3, the first top conductive pattern 24 is not the centrally positioned intermediate the second and third top conductive patterns 26, 28. Rather, the distance or gap separating the second top conductive pattern 26 from the first top conductive 24 is substantially less than the gap separating the third top conductive pattern 28 from the first top conductive pattern 24. The purpose for this unequal spacing will be discussed in more detail below.

As best seen in FIG. 4, disposed on the bottom surface 18 of the substrate 14 is a first (central) bottom conductive pattern 32, a second bottom conductive pattern 34, and a third bottom conductive pattern 36. The second and third bottom conductive patterns 34, 36 are disposed on opposite sides of the first bottom conductive pattern 32 adjacent respective ones of the lateral peripheral edge segments 22 of the substrate 14. The gap or distance separating the second bottom conductive pattern 34 from the first bottom conductive pattern 32 is substantially equal to the gap separating the second top conductive pattern 26 from the first top conductive pattern 24. Similarly, the gap or distance separating the third bottom conductive pattern 36 from the first bottom conductive pattern 32 is substantially equal to the gap separating the third top conductive pattern 28 from the first top conductive pattern 24.

The first bottom conductive pattern preferably comprises at least two spaced apart rows of conductive pads 38 which extend in generally parallel relation to each other and to the lateral peripheral edge segments 22, and thus extend in generally perpendicular relation to the longitudinal peripheral edge segments 20. The conductive pads 38 are preferably arranged in an identical pattern to the conductive pads 30 of the first top conductive pattern 24, with the conductive pads 38 being in aligned registry with and electrically connected to respective ones of the conductive pads 30 of the first top conductive pattern 24. The electrical connection of the conductive pads 30 of the first top conductive pattern 24 to respective ones of the conductive pads 38 of the first bottom conductive pattern 32 is preferably accomplished by plated through-holes or vias extending through the substrate 14. As such, the first top and bottom conductive patterns 24, 32 are electrically connected to each other.

As further seen in FIG. 4, the second and third bottom. conductive patterns 34, 36 each preferably comprise two spaced apart outer rows of conductive pads 40 which extend in generally parallel relation to each other and to the lateral peripheral edge segments 22, and thus extend in generally perpendicular relation to the longitudinal peripheral edge segments 20. In addition to the conductive pads 40, the second and third bottom conductive patterns 34, 36 each include an inner set of conductive pads 42 which are electrically connected to respective ones of the corresponding outer rows of conductive pads 40 via conductive tracings 44.

The conductive pads 40 of the second bottom conductive pattern 34 and the conductive pads 30 of the second top conductive pattern 26 are preferably arranged in identical patterns, with the conductive pads 40 of the second bottom conductive pattern 34 being in aligned registry with and electrically connected to respective ones of the conductive pads 30 of the second top conductive pattern 26. Similarly, the conductive pads 40 of the third bottom conductive pattern 36 and the conductive pads 30 of the third top conductive 28 are preferably arranged in identical patterns, with the conductive pads 40 of the third bottom conductive pattern 36 being in aligned registry with and electrically connected to respective ones of the conductive pads 30 of the third top conductive pattern 28. Like the electrical connection of the conductive pads 30 of the first top conductive pattern 24 to the conductive pads 38 of the first bottom conductive pattern 32, the conductive pads 30 of the second and third top conductive patterns 26, 28 are electrically connected to respective ones of the conductive pads 40 of the second and third bottom conductive patterns 34, 36 by plated through-holes or vias which extend through the substrate 14. As such, the second top and bottom conductive patterns 26, 34 are electrically connected to each other, as are the third top and bottom conductive patterns 28, 36.

Those of ordinary skill in the art will recognize that the conductive pads 30 of the first, second and third top conductive patterns 24, 26, 28 and the conductive pads 38, 40 of the first, second and third bottom conductive patterns 32, 34, 36 may be arranged in patterns differing from those described above and shown in FIGS. 2–4. Additionally, it is contemplated that vias and/or conductive tracings extending within the substrate 14 may be used to electrically connect any one of the conductive pads 30 of the first, second and third top conductive patterns 24, 26, 28 to any one of the corresponding pads 38, 40 of the first, second and third bottom conductive patterns 32, 34, 36.

The conductive pads 30, 38, 40, 42 and conductive tracings 44 are preferably fabricated from very thin copper having a thickness in the range of from about five microns to about twenty-five microns through the use of conventional etching techniques. Advantageously, the use of thin copper for the pads 30, 38, 40, 42 and tracings 44 allows for etching line widths and spacings down to a pitch of about four mils which substantially increases the routing density on the flex circuit 12.

Referring now to FIGS. 3, 5 and 6, in addition to the flex circuit 12, the chip stack 10 of the present invention further comprises two identically configured top chip packages 46 and two identically configured bottom chip packages 48. The top chip packages 46 each comprise a rectangularly configured frame 50 having a first set of frame pads 52 disposed on the top surface thereof and a second set of frame pads 54 disposed on the bottom surface thereof. The frame pads 52, 54 of the first and second sets are preferably arranged in identical patterns, with the frame pads 54 of the second set being in aligned registry with and electrically connected to respective ones of the frame pads 52 of the first set. The electrical connection of the frame pads 52 of the first set to respective ones of the frame pads 54 of the second set may be accomplished by plated through-holes or vias which extend through the frame 50, or by conductive tracings which extend about the inner and/or outer peripheral surfaces thereof. Though the frame pads 52, 54 are shown as extending along both the longitudinal and lateral side segments of the frame 50, those of ordinary skill in the art will recognize that the frame pads 52, 54 may be arranged in any one of a variety of different patterns about the periphery of the frame 50.

In addition to the frame 50, each top chip package 46 comprises a packaged chip 56. The packaged chip 56 is preferably a TSOP (thin small outline package) device comprising a rectangularly configured body 58 defining generally planar top and bottom surfaces, a pair of longitudinal sides, and a pair of lateral sides. Protruding from each of the longitudinal sides of the body 58 are a multiplicity of conductive leads 60 which, as best seen in FIGS. 7A, 7B, and 7C, each preferably have a gull-wing configuration. The rectangular configuration of the body 58 is complimentary to that of the central opening of the frame 50. In this respect, each top chip package 46 is assembled by placing the body 58 of the packaged chip 56 into the central opening of the frame 50 such that the leads 60 rest upon respective ones of the frame pads 52 of the first set disposed on the top surface of the frame 50. The conductive leads 60 are preferably electrically connected to respective ones of the frame pads 52 of the first set through the use of solder or a conductive epoxy. Due to the gull-wing configuration of each of the leads 60, the top surface of the body 58 of the packaged chip 56 is substantially flush with the top surface of the frame 50 when the packaged chip 56 is electrically connected to the frame 50 in the above-described manner.

Each of the bottom chip packages 48 comprises a rectangularly configured frame 62 which is identically configured to the frame 50. In this respect, each frame 62 includes a first set of frame pads 64 disposed on the top surface thereof, and a second set of frame pads 66 disposed on the bottom surface thereof. Like the frame pads 52, 54 of the frame 50, the frame pads 64, 66 of the frame 62 are preferably arranged in identical patterns, with the frame pads 64 of the first set being in aligned registry with and electrically connected to respective ones of the frame pads 66 of the second set. The electrical connection of the frame pads 64, 66 of the first and second sets to each other may be accomplished by plated through-holes or vias extending through the frame 62 or conductive tracings extending about the inner and/or outer peripheral surfaces thereof. Those of ordinary skill in the art will further recognize that the frame pads of 64, 66 of the first and second sets may be arranged in any one of a variety of different patterns about the periphery of the frame 62, and need not necessarily extend along both the longitudinal and lateral side segments thereof.

In addition to the frame 62, each bottom chip package 48 comprises a packaged chip 68 which is preferably a BGA (ball grid array) device. More particularly, the packaged chip 68 comprises a rectangularly configured body 70 which is complimentary to the central opening of the frame 62 and defines generally planar top and bottom surfaces, a pair of longitudinal sides, and a pair of lateral sides. Protruding from the bottom surface of the body 70 are a multiplicity of generally semi-spherically shaped conductive contacts 72. For reasons which will be described in more detail below, the conductive pads 42 of the second and third bottom conductive patterns 34, 36 are each preferably arranged in patterns which are identical to those of the conductive contacts 72 of each packaged chip 68. Additionally, the frame pads 52, 54 of each frame 50, the frame pads 64, 66 of each frame 62, the conductive pads 30 of the first, second and third top conductive patterns 24, 26, 28, and the conductive pads 38, 40 of the first, second and third bottom conductive patterns 32, 34, 36 are all preferably arranged in identical patterns so as so be selectively placeable into aligned registry with each other as will also be described in more detail below. In each bottom chip package 48, the packaged chip 68 is not in direct electrical connection with the corresponding frame 62.

Having thus described the various structural components of the chip stack 10, a preferred method of assembling the same will now be discussed with specific reference to FIGS. 7A, 7B, and 7C. The assembly of the chip stack 10 is preferably initiated by first electrically connecting the top chip packages 46 to each other. Such electrical connection is preferably facilitated by stacking one top chip package 46 upon the other such that the frame pads 54 of the uppermost top chip package 46 are electrically connected to respective ones of the leads 60 of the packaged chip 56 of the lowermost top chip package 46, and hence to those frame pads 52 of the lowermost top chip package 46 to which the leads 60 of the packaged chip 56 thereof are electrically connected. The top chip packages 46 are preferably electrically connected to each other in the above-described manner through the use of solder or a conductive epoxy. As indicated above, when the top chip packages 46 are electrically connected to each other in the above-described manner, the leads 60 of the packaged chip 56 of the lowermost top chip package 46 will extend between the top surface of the frame 50 of the lowermost top chip package 46 and the bottom surface of the frame 50 of the uppermost top chip package 46.

Once the top chip packages 46 have been electrically connected to each other in the above-described manner, they are then electrically connected to the first top conductive pattern 24 of the flex circuit 12, and hence to the first bottom conductive pattern 32. More particularly, the frame pads 54 of the lowermost top chip package 46 are electrically connected to respective ones of the conductive pads 30 of the first top conductive pattern 24 through the use of solder or conductive epoxy. The preferred longitudinal length of the frames 50 are preferably equal to the lateral width of the substrate 14 such that when the lowermost top chip package 46 is electrically connected to the first top conductive pattern 24 in the above-described manner, the outer surfaces of the lateral side segments of the frames 50 are substantially flush with each other and with respective ones of the longitudinal peripheral edge segments 20 of the substrate 14.

Subsequent to the electrical connection of the top chip packages 46 to the first top conductive pattern 24, one of the bottom chip packages 48 is electrically connected to the second bottom conductive pattern 34 (and hence the second top conductive pattern 26), with the remaining bottom chip package 48 being electrically connected to the third bottom conductive pattern 36 (and hence the third top conductive pattern 28). More particularly, the conductive contacts 72 of the packaged chips 68 of the bottom chip packages 48 are electrically connected to corresponding conductive pads 42 of respective ones of the second and third bottom conductive patterns 34, 36 through the use of solder or a conductive epoxy. As indicated above, the conductive contacts 72 and conductive pads 42 of each set are preferably arranged in identical patterns. The frame pads 66 of the frame 62 of one of the bottom chip packages 48 are then electrically connected to respective ones of the conductive pads 40 of the second bottom conductive pattern 34. Similarly, the conductive pads 66 of the frame 62 of the remaining bottom chip package 48 are electrically connected to respective ones of the conductive pads 40 of the third bottom conductive pattern 36. The electrical connection of the conductive pads 66 of the frame 62 of each of the bottom chip packages 48 to corresponding conductive pads 40 of respective ones of the second and third bottom conductive patterns 34, 36 is preferably accomplished through the use of solder or a conductive epoxy.

Importantly, the tracings 44 extending between each set of conductive pads 42 and the corresponding conductive pads 40 in each of the second and third bottom conductive patterns 34, 36 facilitate the electrical connection of the packaged chips 68 of the bottom chip packages 48 to the frame pads 64, 66 of respective ones of the frames 62. In this respect, each conductive contact 72 of each packaged chip 68 is electrically connected to a respective conductive pad 42. Each such conductive pad 42 is itself electrically connected to a respective conductive pad 40 via a corresponding conductive tracing 44. Each conductive pad 40 is itself electrically connected to a corresponding conductive pad 66 of a respective frame 62, with each conductive pad 66 itself being electrically connected to a respective conductive pad 64 on the opposite side or surface of the same frame 62.

As indicated above, each conductive pad 40 of the second bottom conductive pattern 34 is further electrically connected to a respective conductive pad 30 of the second top conductive pattern 26. Similarly, each conductive pad 40 of the third bottom conductive pattern 36 is electrically connected to a respective conductive pad 30 of the third top conductive pattern 28. Thus, the conductive contacts 72 of the packaged chips 68 of the bottom chip packages 48 are electrically connected to corresponding conductive pads 30 of respective ones of the second and third top conductive, patterns 26, 28. Similarly, the leads 60 of the packaged chips 56, in addition to being electrically connected to each other in a desired pattern via the electrical connection of corresponding frame pads 52, 54 of the frames 50 to each other, are also electrically connected to corresponding conductive pads 38 of the first bottom conductive pattern 32 due to the electrical connection of the conductive pads 38 to respective ones of the conductive pads 30 of the first top conductive pad 24 which are in turn electrically connected to respective ones of the frame pads 54 of the lowermost top chip package 46.

As best seen in FIGS. 7A and 7B, upon the electrical connection of the bottom chip packages 48 to respective ones of the second and third bottom conductive patterns 34, 36 in the above-described manner, the flex circuit 12 is folded a first time in a manner wherein the second top conductive pattern 26 is electrically connectable to the uppermost top chip package 46. More particularly, the substrate 14 is folded such that the conductive pads 30 of the second top conductive pattern 26 are brought into aligned registry with respective ones of the frame pads 52 of the uppermost top chip package 46. Corresponding pairs of the pads 30, 52 are then electrically connected to each other through the use of solder or a conductive epoxy. Upon such folding and electrical connection, the frame pads 64 of the bottom chip package 48 electrically connected to the second bottom conductive pattern 34 are exposed.

Thereafter, as seen in FIGS. 7B and 7C, the flex circuit 12 is folded a second time in a manner wherein the third top conductive pattern 28 is electrically connectable to the bottom chip package 48 electrically connected to the second bottom conductive pattern 34. More particularly, the substrate 14 is folded such that the conductive pads 30 of the third top conductive pattern 28 are brought into aligned registry with respective ones of the exposed frame pads 64 of the just stacked bottom chip package 48. The conductive pads 30 of the third top conductive pattern 28 are then electrically connected to respective ones of such frame pads pad 64 through the use of solder or a conductive epoxy. Such electrical connection facilitates the completion of the chip stack 10 as shown in FIGS. 1 and 7C. The size differences in the gaps separating the second and third top conductive patterns 26, 28 from the first top conductive pattern 24 and the second and third bottom conductive patterns 34, 36 from the first bottom conductive patterns 34, 36 from the first bottom conductor pattern 32 as described above provides for a tightly wrapped configuration of the chip stack 10 upon the completion of the folding process. The substrate 14, upon being folded, assists in maintaining the top and bottom chip packages 46, 48 in vertical registry, thus simplifying the assembly process.

The resulting chip stack 10 includes a total of four packaged chips, and more particularly an uppermost pair of packaged chips 68 which each comprise a BGA device, and a lowermost pair of packaged chips 56 which each comprise a TSOP device. Thus, the present chip stack 10 and method of forming the same as described above provides a quick, efficient, and cost effective manner of assembling dissimilar packaged chips into a chip stack wherein the packaged chips may be electrically connected to each other in any, desired manner. In the chip stack 10, the conductive pads 38 of the first bottom conductive pattern 32 are electrically connectable to a substrate such as a printed circuit board or PCB. Additionally, the conductive pads 38 of the first bottom conductive pattern 32 may be used to electrically connect the chip stack 10 to another chip stack 10 in the manner shown in FIG. 1. Due to its configuration, the chip stack 10 provides a high speed ground reference plane in the Z-direction for superior impedance control.

Those of ordinary skill in the art will recognize that an assembly sequence differing from that described above may be employed in relation to the chip stack 10. For example, the bottom chip packages 48 may be electrically connected to respective ones of the second and third bottom conductive patterns 34, 36 prior to the electrical connection of the stacked top chip packages 46 to the first top conductive pattern 24. Additionally, the uppermost top chip package 46 may be electrically connected to the lowermost top chip package 46 subsequent to the electrical connection of the lowermost top chip package 46 to the first top conductive pattern 24. Moreover, though the chip stack 10 is shown and described as including a total of four packaged chips, a chip stack may be assembled to include only three packaged chips by eliminating that portion of the substrate 14 including the third top and bottom conductive patterns 28, 36. It is further contemplated that a chip stack may be assembled to include only two packaged chips if the substrate 14 were formed so as not to include the third top and bottom conductive patterns 28, 36, and only one top chip package 46 was electrically connected to the first top conductive pattern 24.

Additional modifications and improvements of the present invention may also be apparent to those of ordinary skill in the art. For example, the packaged chip 56 included in each top chip package 46 may have a multiplicity of leads 60 extending from both the longitudinal and lateral sides of the body 58 thereof (e.g. a one hundred pin configuration) which are electrically connected to respective ones of corresponding frame pads 52 extending along the longitudinal and lateral side segments of the frame 50. Additionally, the frames 50, 62 may be provided in configurations other than for a rectangular configuration. Thus, the particular combination of parts and steps described and illustrated herein is intended to represent only certain embodiments of the present invention, it is not intended to serve as limitations of alternative devices within the spirit and scope of the invention.

What is claimed is:

1. A method of forming a chip stack, comprising the steps of:
   (a) mounting at least one top chip package including a first packaged chip to a first top conductive pattern disposed on a top surface of a flexible substrate;
   (b) mounting at least one bottom chip package including a second packaged chip differing from the first packaged chip to a second bottom conductive pattern disposed on a bottom surface of the substrate; and
   (c) folding the substrate such that a second top conductive pattern disposed on the top surface and electrically connected to the second bottom conductive pattern is electrically connected to the top chip package.

2. The method of claim 1 wherein:
   step (a) comprises the substeps of:
      (i) mounting a first top chip package to the first top conductive pattern; and
      (ii) electrically connecting a second top chip package to the first top chip package; and
   step (c) comprises the substep of:
      (i) folding the substrate such that the second top conductive pattern is electrically connected to the second top chip package.

3. The method of claim 2 wherein:
   step (b) further comprises the substeps of:
      (i) mounting a first bottom chip package to the second bottom conductive pattern; and
      (ii) electrically connecting a second bottom chip package to a third bottom conductive pattern disposed on the bottom surface of the substrate; and
   step (c) further comprises the substeps of:
      (i) folding the substrate a first time such that the second top conductive pattern is electrically connected to the second top chip package; and
      (ii) folding the substrate a second time such that a third top conductive pattern disposed on the top surface and electrically connected to the third bottom conductive pattern is electrically connected to the first bottom chip package.

4. A method of forming a chip stack comprising the steps of:
   mounting one or more top BGA devices to a first top conductive pattern disposed along a top side of a flexible substrate;
   mounting one or more bottom BGA devices to a first bottom conductive pattern disposed along a bottom side of the flexible substrate;
   folding the flexible substrate such that a second top conductive pattern disposed along the top side and electrically connected to the first bottom conductive pattern is electrically connected to at least one of the one or more top BGA devices.

5. The method of claim 4 in which the one or more top BGA devices is associated with a corresponding keepout area oppositely situated along the bottom side of the flexible substrate, the keepout area having none of the one or more bottom BGA device mounted along it, such that no two BGA devices mounted are directly opposite each other.

* * * * *